United States Patent
Kim et al.

(10) Patent No.: US 8,018,356 B2
(45) Date of Patent: Sep. 13, 2011

(54) METHOD OF ENCODING/DECODING DATA, METHOD OF DETECTING DATA, AND METHOD OF RECORDING/REPRODUCING DATA

(75) Inventors: Na Young Kim, Seoul (KR); Young Soo Jang, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 12/678,253

(22) PCT Filed: Sep. 10, 2008

(86) PCT No.: PCT/KR2008/005334
§ 371 (c)(1),
(2), (4) Date: Mar. 15, 2010

(87) PCT Pub. No.: WO2009/038306
PCT Pub. Date: Mar. 26, 2009

(65) Prior Publication Data
US 2010/0207794 A1      Aug. 19, 2010

(30) Foreign Application Priority Data
Sep. 17, 2007   (KR) .................. 10-2007-0094090

(51) Int. Cl.
*H03M 7/00*   (2006.01)

(52) U.S. Cl. ............................................. 341/50; 341/51
(58) Field of Classification Search .................... 341/50, 341/51
See application file for complete search history.

(56) References Cited

U.S. PATENT DOCUMENTS

| | | | |
|---|---|---|---|
| 4,606,028 A | 8/1986 | Wagenmakers | |
| 6,175,943 B1* | 1/2001 | Yim | 714/769 |
| 6,606,718 B1* | 8/2003 | Bessios | 714/701 |
| 6,850,573 B1* | 2/2005 | Noda | 375/262 |
| 6,950,468 B2* | 9/2005 | Satoh et al. | 375/240.13 |
| 6,982,732 B2* | 1/2006 | Suzuki | 345/693 |
| 2004/0225940 A1 | 11/2004 | Kerr et al. | |
| 2005/0220197 A1 | 10/2005 | Noda | |
| 2005/0286387 A1* | 12/2005 | Ayres et al. | 369/103 |

* cited by examiner

*Primary Examiner* — Jean Jeanglaude
(74) *Attorney, Agent, or Firm* — Birch, Stewart, Kolasch & Birch, LLP

(57) ABSTRACT

According to an embodiment of the present invention, a data encoding method includes separating an input sequence into a plurality of n-bit blocks, wherein n is a natural number, and converting each of the n-bit blocks into a block code including M rows and N columns such that every bit in the block code has at least one identical bit adjacent horizontally or vertically to the bit, wherein M and N are natural numbers.

19 Claims, 3 Drawing Sheets

[Fig. 1]
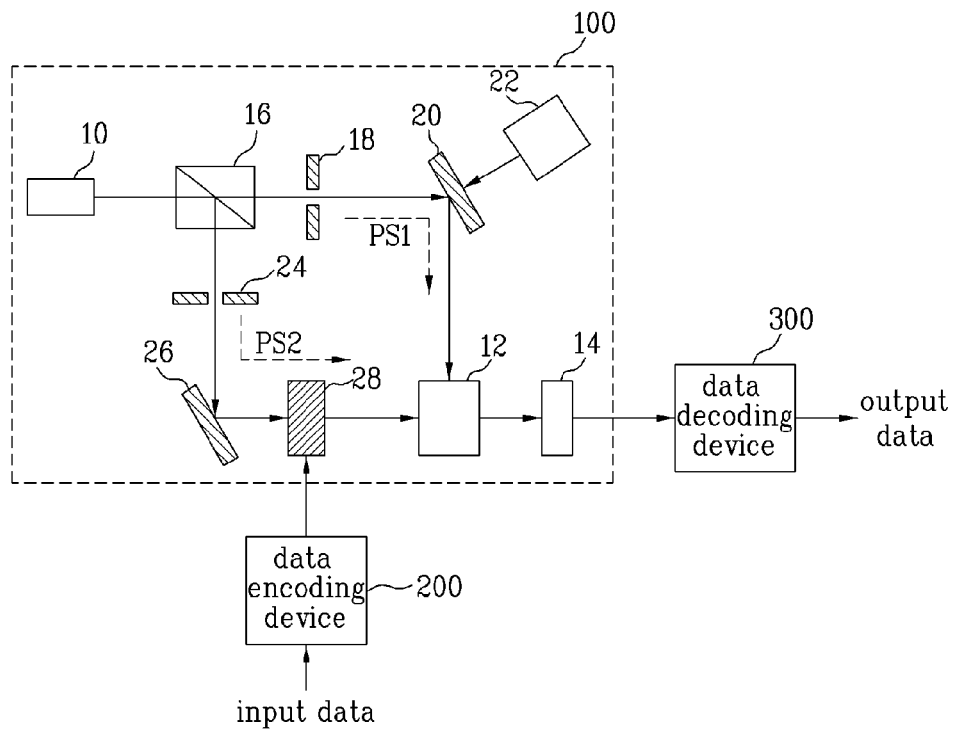
[Fig. 2]
```
000 000 001 010 011 100 110 110
001 101 001 010 001 101 000 110
111 101 011 011 001 001 011 000
000 000 001 010 011 100 110 111
010 110 011 010 010 110 000 001
111 110 001 110 010 100 110 000
000 000 001 011 011 100 110 111
011 111 101 000 011 111 010 010
111 001 100 011 000 000 010 000
000 000 001 011 100 101 110 111
100 111 111 000 100 101 100 100
111 100 000 110 110 000 100 000
```
1 : light pixel
0 : dark pixel

[Fig. 3]
```
0 0 0 0    0 0 0 0    0 0 0 0
0 0 0 0    0 0 0 0    0 0 0 0
1 0 1 1    1 1 0 1    1 1 1 1
1 0 1 1    1 1 0 1    0 0 1 1
0 0 0 0    0 0 0 0    0 0 0 0
0 0 0 0    0 0 0 0    0 0 0 0
1 1 0 0    1 1 1 0    1 1 1 1
1 1 1 1    1 1 1 0    1 0 0 1
```
1 : light pixel
0 : dark pixel
[Fig. 4]
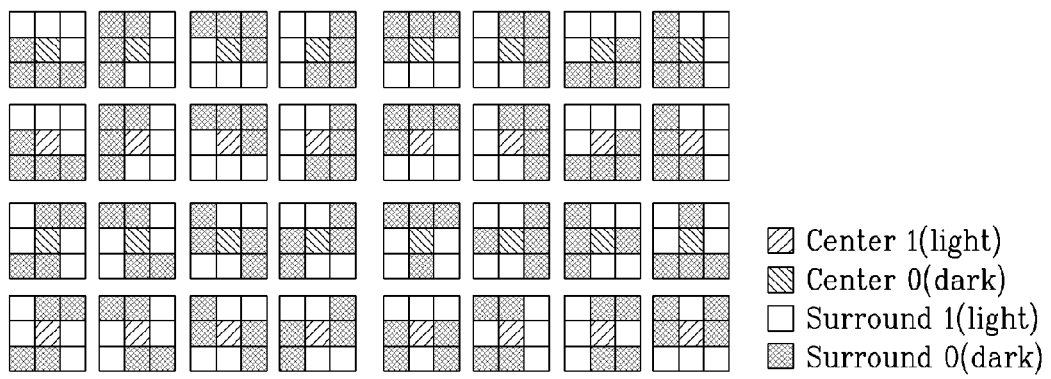
☒ Center 1(light)
▧ Center 0(dark)
☐ Surround 1(light)
▦ Surround 0(dark)

[Fig. 5]
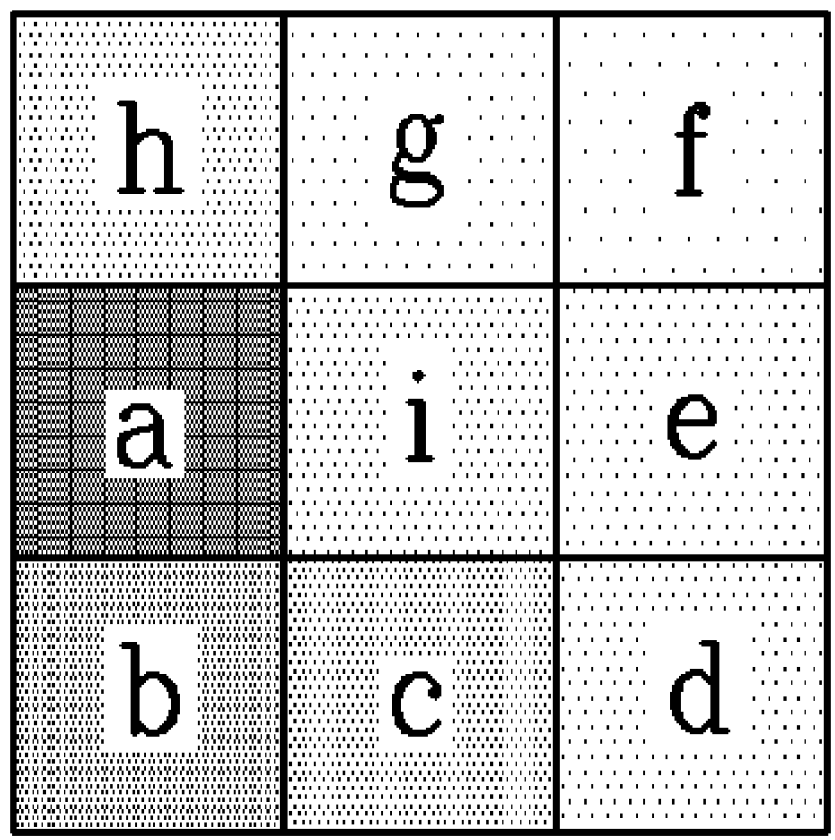

METHOD OF ENCODING/DECODING DATA, METHOD OF DETECTING DATA, AND METHOD OF RECORDING/REPRODUCING DATA

CROSS-RELATED APPLICATIONS

The present invention claims the benefit of PCT International Patent Application No. PCT/KR2008/005334, filed on Sep. 10, 2008, which claims the benefit of Korean Patent Application No. 10-2007-0094090, filed in Korea on Sep. 17, 2007, both of which are hereby incorporated by reference for all purposes as if fully set forth herein.

TECHNICAL FIELD

The present invention relates to a method for encoding and decoding data, a method for detecting data, and a method for recording/reproducing data using the same, and more particularly, to a method for encoding and decoding holographic data using a holographic storage device, a method for detecting data, and a method for recording and reproducing data.

BACKGROUND ART

Recording of data on a holographic storage device is performed by recording the intensity and direction of signal light reflected from a target object. The signal light from the target object interferes with reference light to produce an interference fringe corresponding to the intensity and direction of the signal light and the produced interference fringe is then recorded in a holographic storage medium including a material that reacts to the light according to the intensity of the interference fringe. Data recorded in the storage medium can be read using the reference light used in the process for recording the data and cannot be read using reference light with a wavelength and phase different from those of the reference light used for recording since the reference light with a different wavelength and phase passes through the data recorded in the recording medium.

Utilizing these holographic characteristics, a large amount of data can be recorded at the same place in a recording medium using different reference light beams, thereby enabling storage of a large amount of data in a small recording medium.

Generally, input data is modulated in order to record the data in a recording medium while minimizing the influence of ambient noise and to accurately reproduce the recorded data. Thus, the holographic storage device also uses a modulation code in order to correctly record and reproduce data.

In the holographic storage device, the modulation code needs to be designed so as to prevent the occurrence of Inter-Page Interference (IPI) which is interference between adjacent data pages and Inter-Symbol Interference (ISI) which is interference between pixels in a page when a data page is recorded in a medium.

DISCLOSURE OF INVENTION

Technical Problem

An object of the present invention devised to solve the problem lies on providing a method for encoding and decoding data, which can reduce IPI and ISI, and a method for recording and reproducing data using the same.

Technical Solution

The object of the present invention can be achieved by providing a data encoding method for converting a plurality of n-bit input codes into a plurality of M×L block codes, wherein every bit in each of the block codes has at least one identical bit adjacent horizontally or vertically to the bit.

Here, the plurality of block codes may have the same ratio between the number of 0s and the number of 1s. In this case, each of the block codes may be a 3"3 block code including five 0s and four 1s.

In addition, each of the block codes may be a 4"4 block code including eight 0s and eight 1s, ten 0s and six 1s, or nine 0s and seven 1s.

In addition, each of the block codes may include an odd number of bits, and bits other than a bit located at a center of the block code may have the same number of bit values of 0 and 1. Here, the block code may be a 3"3 block code.

In this case, the number of the block codes may be greater than or equal to the number of possible values of the input code.

In another aspect of the present invention, provided herein is a data detection method for detecting data from data images corresponding to bits included in an encoded block code, wherein every bit in the block code has at least one identical bit adjacent horizontally or vertically to the bit, and bit values of the block code are defined according to relative brightness of the data images.

A bit corresponding to a relatively light data image among the data images may be defined as "1" and a bit corresponding to a relatively dark data image among the data images may be defined as "0".

The block code may include an odd number of bits, and bits other than a bit located at a center of the block code may have the same number of bit values of 0 and 1.

In this case, the data detection method may include obtaining an average brightness level of data images corresponding to "0" and an average brightness level of data images corresponding to "1", comparing the average brightness levels with a brightness level of a data image corresponding to the bit located at the center of the block code, and determining that a bit value corresponding to one of the average brightness level of the data images corresponding to "0" and the average brightness level of the data images corresponding to "1", the one of the two average brightness levels being closer to the brightness level of the data image corresponding to the bit located at the center, is a bit value of the bit located at the center.

In another aspect of the present invention, provided herein is a data decoding method for converting a plurality of M×L block codes into a plurality of n-bit codes, wherein every bit in each of the block codes has at least one identical bit adjacent horizontally or vertically to the bit.

In another aspect of the present invention, provided herein is a data recording method including encoding an input code into a block code, and storing the block code in a recording medium, wherein every bit in the block code has at least one identical bit adjacent horizontally or vertically to the bit.

In another aspect of the present invention, provided herein is a data reproduction method including reading a block code from a recording medium, and converting the block code into a demodulation code, wherein every bit in the block code has at least one identical bit adjacent horizontally or vertically to the bit.

Advantageous Effects

The data encoding/decoding method according to the present invention can prevent interference between adjacent pages and interference between adjacent symbols. The data detection method according to the present invention can reduce the occurrence of errors during signal detection.

BRIEF DESCRIPTION OF THE DRAWINGS

The accompanying drawings, which are included to provide a further understanding of the invention, illustrate exemplary embodiments of the invention and together with the description serve to explain the principle of the invention.

In the drawings:

FIG. 1 schematically illustrates an example of an apparatus for recording and reproducing data which can perform a data encoding/decoding method according to an exemplary embodiment of the present invention.

FIG. 2 schematically illustrates an example of block codes that can be used in a data encoding/decoding method according to a first exemplary embodiment of the present invention.

FIG. 3 schematically illustrates another example of block codes that can be used in the data encoding/decoding method according to the first exemplary embodiment of the present invention.

FIG. 4 schematically illustrates an example of data images of block codes that can be used in a data encoding/decoding method according to a second exemplary embodiment of the present invention.

FIG. 5 schematically illustrates pixels of block codes to explain a method for determining a bit value of a central pixel in the data encoding/decoding method according to the second exemplary embodiment of the present invention.

BEST MODE FOR CARRYING OUT THE INVENTION

The above and other aspects of the present invention will be described in detail through exemplary embodiments with reference to the accompanying drawings so that the present invention can be easily understood and realized by those skilled in the art.

FIG. 1 schematically illustrates an example of a holographic recording/reproduction system that can perform a data encoding/decoding method according to an exemplary embodiment of the present invention. As shown in FIG. 1, the holographic recording/reproduction system includes a recording/reproduction apparatus 100, a data encoding device 200, and a data decoding device 300.

The recording/reproduction apparatus 100 includes a light source 10 for generating a laser beam required in holography, a storage medium 12 (for example, a photorefractive crystal) for storing three-dimensional data (i.e., an interference fringe), and a Charged Coupled Device (CCD) 14. Two paths (i.e., a reference light processing path PS1 and a signal light processing path PS2) including a number of optical systems are formed between the light source 10 and the storage medium 12.

The optical splitter 16 splits the laser beam incident from the light source 10 into reference light and signal light. The split reference light, which is vertically polarized, is provided to the reference light processing path PS1 and the split signal light is provided to the signal light processing path PS2.

The shutter 18, the reflector 20, and the actuator 22 are arranged parallel to the emission direction of the reference light in the reference light processing path PS1. In the reference light processing path PS1, reference light required to record or reproduce data is reflected at a preset deviation angle to be provided to the storage medium 12.

Although not illustrated in FIG. 1, a number of optical lenses (for example, a waist creation lens and a beam expander) for reference light processing may be provided in the reference light processing path PS1.

The vertically polarized reference light incident via the shutter 18 after being deviated from the optical splitter 16 is adjusted through an optical lens or the like so that the sectional beam size of the reference light is increased to a specific size. The reference light then deviates at a preset angle (for example, a recording angle preset for recording or a reproduction angle preset for reproduction) through the reflector 20 and is then emitted to the storage medium 12.

Here, the reference light used during recording or reproduction can be controlled by rotating the reflector 20 using the actuator 22 to change the deviation angle thereof each time binary data of each page is recorded in the storage medium 12. Through this reference light deviation method, hundreds or thousands of pieces of data can be stored or read in or from the storage medium 12.

On the other hand, a shutter 24, a reflector 26, and a spatial light modulator 28 are sequentially arranged parallel to the emission direction of the signal light in the signal light processing path PS2. The shutter 24 is kept open in a recording mode and is kept closed in a reproduction mode under control of a system controller (not shown).

Although not illustrated in FIG. 1, a number of optical lenses (for example, a reimaging lens, a beam expander, and a field lens) for signal light processing may be provided in the signal light processing path PS2. Accordingly, the signal light incident through an opening of the shutter 24 after being deviated from the optical splitter 16 is reflected at a preset deviation angle through the reflector 26 and is then provided to the spatial light modulator 28.

The spatial light modulator 28 modulates the signal light received from the reflector 26 into a binary data image including light and dark pixels according to input data provided from the data encoding device 200 (i.e., according to data encoded using a data encoding method according to the embodiment of the present invention that is described later). Here, pixels of the data image correspond respectively to bits included in a block code described later.

For example, when the input data is image data of a frame of a picture, the signal light incident on the spatial light modulator 28 is modulated into signal light of the frame and the modulated signal light is then incident on the storage medium 12 in synchronization with the reference light incident from the reflector 20 in the reference light processing path PS1.

Accordingly, an interference fringe obtained through interference between the signal light modulated for each page of the binary data image provided from the spatial light modulator 28 in the recording mode and the corresponding reference light for recording that is incident from the reflector 20 at a deviation angle is recorded in the storage medium 12. That is, photoinduction of mobile charges occurs inside the storage medium 12 according to the intensity of the interference fringe obtained by the interference between the modulated signal light and the reference light and the interference fringe of data is recorded in the storage medium 12 through this process.

On the other hand, the data encoding device 200 separates an input sequence received from the outside into n-bit blocks and converts each n-bit block of the input sequence into a corresponding M×L-bit block code according to an encoding method according to the embodiment of the present invention. This encoding method will be described later.

The data encoding device 200 transfers binary data of one page encoded in this manner to the spatial light modulator 28. Accordingly, the spatial light modulator 28 modulates the signal light incident from the reflector 26 for each page of the binary data including light and dark pixels and emits the modulated signal light to the storage medium 12. In this manner, data coded according to the present invention is stored in the storage medium 12.

On the other hand, when data, which is recorded in the storage medium 12 after being coded according to the encoding method according to the embodiment of the present invention, is reproduced, the shutter 24 of the signal light processing path PS2 is closed under control of the system controller (not shown) while the shutter 18 of the reference light processing path PS1 is opened.

Accordingly, the reference light (reference light for reproduction) deviated from the optical splitter 16 is reflected at the reflector 20 to be emitted to the storage medium 12. The interference fringe that has been recorded in the storage medium 12 through the reference light for recording diffracts the reference light for reproduction incident on the storage medium 12 to demodulate the interference fringe into a binary data signal of one page including original light and dark pixels (in checkerboard patterns) and the demodulated reproduction signal is then emitted to the CCD 14.

The CCD 14 reconstructs original data (i.e., an original electric signal) from the reproduction light emitted from the storage medium 12 and the reconstructed reproduction signal is then transferred to the data decoding device 300.

The data decoding device 300 decodes the coded reproduction signal that is output through the CCD 14 after being reproduced from the storage medium 12 into original data as present prior to coding (i.e., the input sequence signal described above). This decoding method will be described later.

Although the configuration of the holographic recording/reproduction system has been illustrated, the present invention is not limited to this configuration and other components may be added to or some components may be omitted from the holographic recording/reproduction system as needed.

Reference will now be made in detail to an encoding method and a decoding method according to an exemplary embodiment of the present invention. An n-bit input sequence is modulated into an M×L-bit channel sequence in the encoding method according to the embodiment of the present invention and an M×L-bit channel sequence is demodulated into an n-bit input sequence in the decoding method according to the embodiment of the present invention. Here, an array of M×L bits with M bits arranged in a horizontal direction and L bits arranged in a vertical direction is defined as a block code.

FIGS. 2 and 3 schematically illustrate example block codes that can be used in an encoding/decoding method according to a first exemplary embodiment of the present invention. FIG. 2 illustrate 3×3 block codes, each of which is used to modulate a 5-bit input sequence into a 9-bit channel sequence and FIG. 3 illustrate 4×4 block codes, each of which is used to modulate a 10-bit input sequence into a 16-bit channel sequence.

However, the present invention is not limited to the example block codes shown in FIGS. 2 and 3 and encoding/decoding may be performed using block codes of various other sizes.

Constraints of a block code used to convert an n-bit input sequence into an M×L-bit channel sequence in this embodiment will now be described in detail with reference to FIGS. 2 and 3.

First, the number of possible values of an n-bit input sequence is $2^n$. In addition, the number of possible values of an M×L-bit input sequence is $2^{M\times L}$. That is, in the above example, the number of possible values of the 5-bit input sequence is $2^5=32$ and the number of possible values of the 9-bit channel sequence is $2^9=512$. In addition, the number of possible values of the 10-bit input sequence is $2^{10}=1024$ and the number of possible values of the 16-bit channel sequence is $2^{16}=65536$.

Here, in the encoding method according to this embodiment, every bit in a block code has at least one identical bit adjacent horizontally or vertically to the bit. That is, the same bit is repeated at least once in a horizontal or vertical direction in the block code. The block code has no isolated bit since the same bit is repeated at least once in a horizontal or vertical direction. That is, as shown in FIGS. 2 and 3, there is no 0 surrounded by 1s and there is no 1 surrounded by 0s. Accordingly, when a block code is converted into a binary data image including light and dark pixels, it is possible to prevent each pixel from suffering from inter-symbol interference with adjacent symbols (i.e., pixels).

The encoding method according to this embodiment uses block codes, each of which includes x 0s and (M×L)−x 1s, among $2^{M\times L}$ block codes. That is, the block codes have the same ratio between the number of 0s and the number of 1s. Due to this constraint, the intensity of light of each page of a data image, which includes a plurality of block codes as described above, is similar. Thus, the constraint can prevent inter-page interference (IPI) between adjacent data pages.

FIG. 2 illustrates an example where the number of 0s is 5 and the number of 1s is 4 and FIG. 3 illustrates an example where the number of 0s is 10 and the number of 1s is 6. However, the present invention is not limited to these examples. Especially, a 4"4 block code may include 8 0s and 8 1s or 9 0s and 7 1s, unlike 4"4 block codes illustrated in FIG. 3. That is, it is preferable that the number of 0s and the number of 1s in a block code be similar. Accordingly, each page has pseudo-balanced modulation code characteristics.

In this embodiment, the number of channel sequences satisfying the two constraints for each block code among $2^{M\times L}$ channel sequences should be greater than or equal to the number of $2^n$ possible values of the n-bit input sequences. According to the constraints, each of the block codes of FIG. 2 includes 5 0s and 4 1s and the same bit is repeated at least once in each block code. The number of block codes satisfying the constraints among a total of 512 possible block codes is 32, which is equal to the number of possible values of the 5-bit input sequence.

In the case of FIG. 3, block codes, each of which includes 10 0s and 6 1s, are used among a total of 65536 possible block codes. The number of block codes satisfying the constraint that the same bit be repeated at least once in a horizontal or vertical direction is 1070. This number of block codes is greater than the number of possible values of a 10-bit input sequence (i.e., 1024), thereby satisfying the constraint described above.

Accordingly, such block codes can prevent IPI and ISI since the intensity of light of each page is similar and there is no isolated bit.

Reference will now be made to a data detection method and a decoding method according to the first exemplary embodiment of the present invention.

As described above, when encoded data recorded in a recording medium is reproduced, an interference fringe that has been recorded in the storage medium 12 through the reference light for recording diffracts the reference light for reproduction incident on the storage medium 12 to demodulate the interference fringe into a binary data signal of one page including original light and dark pixels (in checkerboard patterns).

The CCD decodes an M×L-bit reproduction signal reconstructed in this manner into original data as present prior to coding, i.e., an n-bit input sequence described above.

First, reference is made in detail to a method for detecting a data signal from a data image including light and dark pixels according to the first exemplary embodiment of the present invention.

As described above, in this embodiment, block codes have the same number of 0s and the same number of 1s. That is, (M×L)−x 1s and x 0s are distributed in each block code. Utilizing this fact, (M×L)−x bits selected in order of decreasing brightness (i.e., decreasing gray level) of the data image are defined as "1 (i.e., light)" and the remaining x bits are defined as "0 (i.e., dark)".

Specifically, in the case of FIG. 2, 4 pixels with high gray levels among 9 data image pixels are defined as "1" and the remaining 5 pixels are defined as "0". In the case of FIG. 3, 6 bits (pixels) with high gray levels among 16 pixels are defined as "1" and the remaining 10 bits are defined as "0". This signal detection method reduces the possibility of error occurrence, compared to the case where bits are defined based on a specific reference level.

Then, an M×L-bit block code signal detected in this manner is converted into a corresponding demodulation code (i.e., an n-bit input sequence), thereby decoding data. The decoding method in this embodiment performs the reverse of encoding using the code block.

Reference will now be made in detail to encoding and decoding methods and a data detection method according to a second exemplary embodiment of the present invention. In the encoding method according to this embodiment, every bit in a block code has at least one identical bit adjacent horizontally or vertically to the bit, similar to the first embodiment described above. That is, the same bit is repeated at least once in a horizontal or vertical direction in the block code. This prevents the occurrence of ISI as described above.

On the other hand, a block code has an odd number of bits in the encoding method according to this embodiment. In addition, among the odd number of bits, bits other than a bit located at the center of the block code have the same number of 0s and 1s. In this case, the bit located at the center may be 0 or 1. Thus, unlike the first exemplary embodiment, block codes of this embodiment have different ratios between 0s and 1s. The ratio between 0s and 1s varies according to the bit located at the center.

FIG. 4 illustrates data images of 3"3-bit block codes as the data images of the block codes in the encoding/decoding method according to the second exemplary embodiment of the present invention. This embodiment will now be described in detail with reference to FIG. 4.

As illustrated in FIG. 4, 9 bits are arranged in a matrix of 3"3 bits so that the number of "1" bits and the number of "0" bits other than a bit located at the center are each 4. Accordingly, the peripheral bits have balanced characteristics.

However, a difference is made according to whether the bit value of the bit located at the center is 1 or 0. Accordingly, block codes according to this embodiment have pseudo-balanced characteristics.

A method for detecting data coded using the encoding method according to the second exemplary embodiment of the present invention and a method for decoding the detected data are described below in detail.

First, reference is made to the data detection method according to this embodiment. A data image reproduced from a holographic storage device is corrected and the corrected data image is then converted into a corrected gray level.

First, bit values of peripheral bits located around a bit located at the center are determined. As described above, peripheral bits of a block code according to this embodiment have the same number of 0s and 1s. Accordingly, each pixel with a high gray level (i.e., a light pixel) is defined as "1" and each pixel with a low gray level (i.e., a dark pixel) is defined as "0".

That is, the bit values of 4 bits with high gray levels among bits corresponding to data images of peripheral pixels other than a pixel located at the center are determined to be "1" and the bit values of 4 bits with low gray levels are determined to be "0".

Then, the bit value of the pixel located at the center is determined. The bit value of the pixel located at the center can be determined using various methods. An example method for determining the bit value of the pixel located at the center is described below with reference to FIG. 5.

As shown in FIG. 5, respective gray levels of the corrected pixels are defined as a, b, c, d, e, f, g, h, and i.

First, an average gray level mlight of four pixels selected in order of decreasing brightness from among peripheral bits is calculated. In the example of FIG. 5, mlight is (f+g+e+d)/4. In addition, an average gray level mdark of four pixels selected in order of increasing brightness from among the peripheral bits is calculated. In the example of FIG. 5, mdark is (a+b+c+d)/4. Then, respective Euclidean distances between the gray level (i) of the central bit and the two average gray levels are calculated.

Here, when the Euclidean distance between the gray level (i) of the central bit and the average gray level mlight is denoted by "A" and the Euclidean distance between the gray level (i) of the central bit and the average gray level mdark is denoted by "B", "A" can be represented by Mathematical Expression 1 and "B" can be represented by Mathematical Expression 2.

$$\text{abs}(i - m_{light})$$ MATHEMATICAL EXPRESSION 1

$$\text{abs}(i - m_{dark})$$ MATHEMATICAL EXPRESSION 2

When A is greater than B, i.e., when the gray level (i) of the pixel located at the center is closer to the average gray level mlight of the light pixels, the bit value of (i) is defined as "1 (light)". On the other hand, when B is greater than A, i.e., when the gray level (i) of the pixel located at the center is closer to the average gray level mdark of the dark pixels, the bit value of (i) is defined as "0 (dark)".

The bit value of the central pixel is defined using this method. A data signal is detected using this method to generate a code block according to the second exemplary embodiment of the present invention. The data decoding method according to this embodiment is a procedure for converting the code block generated in this manner into an original input sequence. This procedure is performed according to the reverse of the encoding method according to the second exemplary embodiment of the present invention.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A data encoding method comprising:
separating an input sequence into a plurality of n-bit blocks, wherein n is a natural number; and converting each of the n-bit blocks into a block code including M rows and N columns such that every bit in the block code has at least one identical bit adjacent horizontally or vertically to the bit,
wherein M and N are natural numbers.

2. The method of claim 1, wherein the block code has the same ratio between the number of 0s and the number of 1s.

3. The method of claim 2, wherein the block code is a 3"3 block code including five 0s and four 1s.

4. The method of claim 2, wherein the block code is a 4"4 block code including eight 0s and eight 1s, ten 0s and six 1s, or nine 0s and seven 1s.

5. The method of claim 1, wherein the block code includes an odd number of bits, and bits other than a bit located at a center of the block code have the same number of bit values of 0 and 1.

6. The method of claim 5, wherein the block code is a 3"3 block code.

7. The data encoding method of claim 1, wherein the number of the block code is greater than or equal to the number of possible values of the input code.

8. A data reproduction method comprising:
detecting a plurality of block codes including M rows and N columns from data images stored in a storage medium, wherein M and N are natural numbers, every bit in each of the block codes has at least one identical bit adjacent horizontally or vertically to the bit, and bit values of each of the block codes are defined according to relative brightness of the data images;
converting each of the block codes into n-bit codes, wherein n is a natural number; and
combining the n-bit codes into an output sequence.

9. The method of claim 8, wherein a bit corresponding to a relatively light data image among the data images is defined as "1" and a bit corresponding to a relatively dark data image among the data images is defined as "0".

10. The method of claim 9, wherein each of the block codes includes an odd number of bits, and bits other than a bit located at a center of each of the block codes have the same number of bit values of 0 and 1.

11. The method of claim 10, further comprising:
obtaining an average brightness level of data images corresponding to "0" and an average brightness level of data images corresponding to "1";
comparing the average brightness levels with a brightness level of a data image corresponding to the bit located at the center of each of the block codes; and
determining that a bit value corresponding to one of the average brightness level of the data images corresponding to "0" and the average brightness level of the data images corresponding to "1", the one of the two average brightness levels being closer to the brightness level of the data image corresponding to the bit located at the center, is a bit value of the bit located at the center.

12. The method of claim 11, wherein each of the block codes is a 3"3 block code.

13. A data decoding method comprising:
receiving a plurality of block codes including M rows and N columns, wherein M and N are natural numbers and every bit in each of the block codes has at least one identical bit adjacent horizontally or vertically to the bit; and
converting each of the plurality of block codes into n-bit codes, wherein n is a natural number.

14. The method of claim 13, wherein each of the plurality of block codes has the same ratio between the number of 0s and the number of 1s.

15. The method of claim 14, wherein each of the plurality of block codes is a 3"3 block code including five 0s and four 1s.

16. The method of claim 14, wherein each of the plurality of block codes is a 4"4 block code including eight 0s and eight 1s, ten 0s and six 1s, or nine 0s and seven 1s.

17. The method of claim 13, wherein each of the plurality of block codes includes an odd number of bits, and bits other than a bit located at a center of each of the plurality of block codes have the same number of bit values of 0 and 1.

18. The method of claim 17, wherein each of the plurality of the block codes is a 3"3 block code.

19. A data recording method comprising:
separating an input sequence into a plurality of n-bit blocks, wherein n is a natural number;
converting each of the n-bit blocks into a block code including M rows and N columns such that every bit in the block code has at least one identical bit adjacent horizontally or vertically to the bit, wherein M and N are natural numbers; and
storing the encoded block code in a recording medium.

* * * * *